United States Patent [19]

Mitumoto et al.

[11] Patent Number: 5,795,919
[45] Date of Patent: Aug. 18, 1998

[54] INSULATING PAINTS

[75] Inventors: Seiichi Mitumoto; Shigeto Maejima; Takashi Masuda; Isamu Karino, all of Tokyo, Japan

[73] Assignee: Mitsubishi Denki Kabushiki Kaisha, Tokyo, Japan

[21] Appl. No.: 827,452

[22] Filed: Mar. 28, 1997

[30] Foreign Application Priority Data

Apr. 3, 1996 [JP] Japan .................................. 8-081689

[51] Int. Cl.$^6$ .................................................. C08J 5/22
[52] U.S. Cl. ........................ 521/28; 521/27; 524/414
[58] Field of Search ..................... 521/27, 28; 524/409, 524/411, 414, 436, 445, 451

[56] References Cited

U.S. PATENT DOCUMENTS

| | | | |
|---|---|---|---|
| 3,847,857 | 11/1974 | Haag | 521/28 |
| 4,007,301 | 2/1977 | Martino | 521/28 |
| 4,100,077 | 7/1978 | Burt | 524/409 |
| 4,284,762 | 8/1981 | Miyata | 524/451 |
| 4,435,459 | 3/1984 | McKinney | 524/409 |
| 4,453,991 | 6/1984 | Grot | 521/28 |
| 4,487,862 | 12/1984 | Maruya | 524/414 |
| 4,698,375 | 10/1987 | Dorman | 524/417 |
| 4,743,644 | 5/1988 | Skipper | 524/411 |
| 4,879,316 | 11/1989 | Alexandratos | 521/27 |
| 5,049,594 | 9/1991 | Jeffs | 524/445 |
| 5,122,565 | 6/1992 | George | 524/436 |
| 5,205,963 | 4/1993 | Brito | 521/28 |
| 5,346,924 | 9/1994 | Giuffrida | 521/28 |
| 5,547,551 | 8/1996 | Bahar | 521/27 |

FOREIGN PATENT DOCUMENTS

| | | |
|---|---|---|
| 62-55242 | 11/1987 | Japan . |
| 63-119880 | 5/1988 | Japan . |
| 63-295682 | 12/1988 | Japan . |

OTHER PUBLICATIONS

Database WPI, Derwent Publications, AN 86–052909, JP 61–007326, Jan. 14, 1986.

Database WPI, Derwent Publications, AN 76–29310X, JP 51–026934, Mar. 5, 1976.

*Primary Examiner*—Paul R. Michl
*Attorney, Agent, or Firm*—Oblon, Spivak, McClelland, Maier & Neustadt, P.C.

[57] ABSTRACT

An object of the present invention is to provide a method of recovering the insulation by means of simple steps rapidly and easily at low cost, and paints used therefor. For that purpose, the insulating paint of the present invention which comprises an electric insulation film forming agent and an ion-exchangeable material is applied on the part of a printed circuit board where the insulation was lowered or is expected to be lowered.

7 Claims, 5 Drawing Sheets

> 5,795,919

1

INSULATING PAINTS

TECHNICAL FIELD OF THE INVENTION

The present invention relates to a method of previously protecting from lowering of electric insulation initially provided in various electrical and electronic parts, or a method of recovering a lowered electric insulation, and further relates to insulating paints used therefor.

Particularly the present invention relates to the insulating paints which are used for printed circuit boards and electronic parts for many electronic apparatuses such as a color television set and VTR in order to recover electric insulation of electric circuits by applying the insulating paints to the printed circuit board on which a solution containing an electrolyte and having leaked from condensers used on such electronic apparatuses and by capturing the leaked electrolyte; and relates to the printed circuit board coated with such a paint, the method of previously protecting the insulation of the printed circuit board from lowering by applying the insulating paints thereon and the method of recovering the lowered insulation by using the insulating paint.

BACKGROUND OF THE INVENTION

Electrical and electronic apparatuses have many parts therein, which must be insulated. Typical examples thereof are a printed circuit board, etc. However, there is a case where the electric insulation cannot be maintained during use. For example, there is a case where lowering of insulation occurs due to leakage of an electrolyte from an electrolytic condenser or spilling of coffee or soy sauce. As a result, for instance, in case of a television set, there occur chromatic difference and delay of screen, and in the worst case, no picture appears at all. In case of a portable telephone, there occurs a bad call, etc. It is considered that the above-mentioned lowering of insulation is caused due to the electrolyte adhering between the parts requiring the insulation. When the lowering of insulation occurs, it is usual, in the repairing procedures, to replace defective parts after cleaning with a fleon-containing solvent or alcohol or to replace the printed circuit board by a new one in case where many parts are mounted on both surfaces of the board at high density.

However, if the lowered insulation can be recovered and the recovered insulation can be maintained without replacing the printed circuit board, it brings about incalculable economical value.

In JP-B-55242/1987, there is proposed an attempt to capture impurity ions such as an alkali metal ion and halogen ion by means of an inorganic ion-exchangeable substance such as antimony oxide or tin chloride to maintain insulation of molded articles for protection of electronic parts. However, the protective material proposed in that patent publication is used to capture impurity ions which are present originally in known molded article for protection such as glass having a low melting point, epoxy resin and phenol resin, then to prevent insulation of the molded article from lowering, and is not used to capture externally generated ions from the electrolyte. Therefore, means proposed in that patent publication cannot cope with lowering of insulation which is suddenly caused at unexpected portions by external factors.

An object of the present invention is to prevent lowering of insulation or recover lowered insulation which is caused due to external factors, particularly adhesion of electrolyte.

An another object of the present invention is to provide a method of recovering the insulation by means of simple steps rapidly and easily at low cost, and paints used therefor.

SUMMARY OF THE INVENTION

According to the present invention, there can be provided an insulating paint which comprises an electric insulation film forming agent and an ion-exchangeable material.

According to the present invention, there can be also provided a method of recovering insulation by applying the above-mentioned insulating paint to a portion where the insulation is lowered.

According to the present invention, there can be provided a method of protecting electric insulation from lowering by previously applying the above-mentioned insulating paint to at least a portion or part where lowering of insulation may occur.

The above-mentioned insulating paint and methods according to the present invention are applicable to the portions or parts where the lowering of the insulation may occur by external factors. The above-mentioned insulating paint and the methods exhibit excellent practical effects particularly when applied to wiring parts of the printed circuit board or electronic parts mounted or to be mounted on the board.

DETAILED DESCRIPTION OF THE INVENTION

Figure 1:
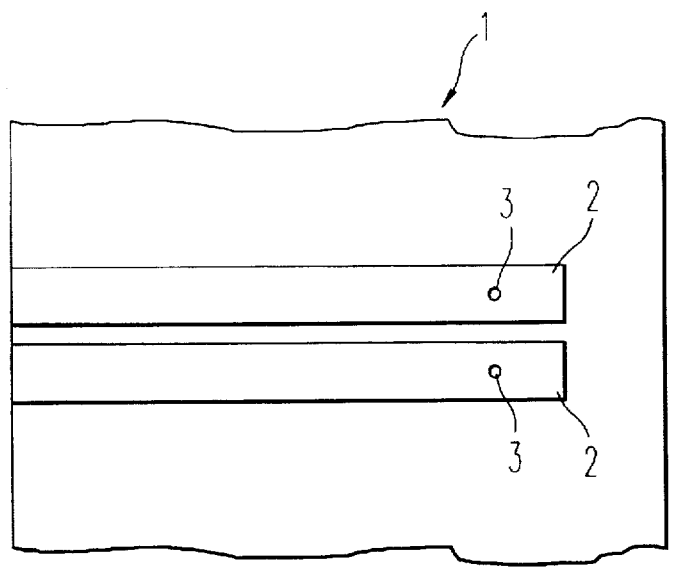
FIG. 1 is a diagrammatic plan view of the printed circuit board used in Experiments of the present invention.

Concept of the present invention is basically to capture ions coming from the outside by means of ion exchange ability of an ion-exchangeable material and to prevent lowering of insulation which is caused due to transferring of those external ions.

For example, in an electrolytic condenser mounted on a printed circuit board, an electrolyte comprising ditetramethylammonium phthalate(DTAP) and γ-butyrolactone is sealed with a sealing rubber such as butyl rubber. But an electrolytic product attacks the butyl rubber to cause leakage of hygroscopic quaternary ammonium ions:

and phthalic acid ion and then to lower the insulation between connection terminals of the condenser and between wirings near the condenser. According to the present invention, the transferring of the quaternary ammonium ions are stopped by capturing those ions by a cation exchangeable material to recover the insulation. In that case, hydrogen ions produced by the ion exchange are bonded to phthalic acid ions which are anionic ions, and become an acid. It may be considered that such an acid does not cause lowering of insulation since its degree of dissociation is low. Kinds and combinations of the ion-exchangeable materials used can be selected depending on kind of the electrolyte. Those are described hereinafter.

As mentioned above, the insulating paint of the present invention comprises the insulation film forming agent and the ion-exchangeable material.

The ion-exchangeable material may be one which captures and fixes the electrolytic ions which enter from the outside and cause lowering of insulation. The ion-exchangeable material is roughly classified into an ion-exchange resin which is an organic compound and an inorganic ion-exchangeable material. Any of them can be used alone or in a mixture. The ion-exchange resin has an advantage of a low specific gravity, and the inorganic ion-exchangeable material has an advantage of good heat resistance.

The ion-exchangeable material is classified, from another aspect, into a cation exchangeable material and an anion exchangeable material. The cation exchangeable material is used when the electrolytic ions which cause the lowering of insulation are cations (for example, an alkali metal ion such as Na, K or Li; other metal ion such as Ag, Cu, Fe, Pb, Sn, Zn, Mg or Ca; and an ammonium ion such as tetramethylammonium ion or trimethylammonium ion). The anion exchangeable material is used when the electrolytic ions which cause lowering of insulation are anions (for example, a halogen ion such as Cl, Br or I; an oxide ion such as $SO_4$, $NO_3$ or $NO_2$; and an organic acid ion such as formic acid, acetic acid or phthalic acid). It is a matter of course that both of the ion-exchangeable materials may be used.

The cation exchangeable material and anion exchangeable material can be classified into a strongly acidic cation exchangeable material and weakly acidic cation exchangeable material and a strongly acidic anion exchangeable material and weakly acidic anion exchangeable material, respectively. Uses of those materials are decided depending on the electrolyte to have been used. This matter is explained hereinbelow.

As mentioned above, there are the cation exchange resin and anion exchange resin as the ion-exchange resins used in the present invention.

As the cation exchange resin, there are strongly acidic cation exchange resins and weakly acidic cation exchange resins, and in the present invention, any of them can be used.

Examples of the strongly acidic cation exchange resin are, for instance, styrene-divinylbenzene copolymer, phenolformalin resin or the like as a main structure to which sulfonic acid group is bonded as ion-exchangeable group. Those are commercially available, for example, Amberlite-IR120B (available from Rohm & Haas Co., Ltd.), Diaion SK-1A (available from Mitsubishi Kagaku Kabushiki Kaisha) and Diaion FMK-10 (available from Mitsubishi Kagaku Kabushiki Kaisha).

Examples of the weakly acidic cation exchange resin are, for instance, copolymer of acrylate or methacrylate and divinylbenzene as a main structure to which carboxyl group, phosphonic group or the like is bonded as ion-exchangeable group. Those are commercially available, for example, Amberlite-IRC-84 (available from Rohm & Haas Co., Ltd.) and Diaion WK-11 (available from Mitsubishi Kagaku Kabushiki Kaisha).

As the anion exchange resin, there are strongly basic anion exchange resins and weakly basic anion exchange resin, and in the present invention, any of them can be used.

Examples of the strongly basic anion exchange resin are, for instance, styrene-divinylbenzene copolymer as a main structure to which trimethylammonium group, β-hydroxyethyldimethylammonium group or the like is bonded as ion-exchangeable group. Those are commercially available, for example, Amberlite-IRA-400 (available from Rohm & Haas Co., Ltd.), Diaion SA-10B (available from Mitsubishi Kagaku Kabushiki Kaisha) and Diaion FMA-10 (available from Mitsubishi Kagaku Kabushiki Kaisha).

Examples of the weakly basic anion exchange resin are, for instance, styrene-divinylbenzene copolymer, copolymer of acrylate or methacrylate and divinylbenzene or the like as a main structure to which primary, secondary or tertiary amino group or the like is bonded as ion-exchangeable group. Those are commercially available, for example, Amberlite-IRA-93 (available from Rohm & Haas Co., Ltd.) and Diaion WA-30 (available from Mitsubishi Kagaku Kabushiki Kaisha).

Also, there are the inorganic cation exchangeable inorganic substance and inorganic anion exchangeable substance as the inorganic ion-exchangeable substances which are another ion-exchangeable materials used in the present invention.

Examples of the inorganic cation exchangeable inorganic substance are, for instance, polyvalent metallic acids such as zeolite, antimonic acid, stannic acid, titanic acid, niobic acid, manganese acid and salts thereof; salts of polybasic acid with polyvalent metal such as zirconium phosphate, titanium phosphate, tin phosphate, cerium phosphate, tin arsenate and titanium arsenate; heteropoly-acids such as molybdic acid and tungstic acid; and the like.

Examples of the inorganic anion exchangeable substance are, for instance, hydroxides such as hydrotalcite, hydroxyapatite, iron hydroxide, zirconium hydroxide and bismuth hydroxide.

Those ion-exchangeable materials can be used alone or in a mixture thereof depending on kind of electrolytes to be captured.

There are a variery of electrolytes which cause lowering of insulation. It is presumed that the lowering of insulation due to the electrolyte is caused by transferring of dissociated electrolytic ions, as mentioned above. Therefore, it is preferable to select the ion-exchangeable materials depenidng on kind, degree of dissociation and ionic strength of the electrolyte which is expected to adhere.

Embodiments of application manner of the ion-exchangeable materials and kinds of electrolytes are explained hereinbelow, but the present invention is not limited to them.

(1) Embodiment of using both of cation exchangeable material and anion exchangeable material This embodiment is suitable in case where the electrolyte is a salt. Examples of the electrolyte are, for instance, salts of strong acid and strong base such as NaCl, NaBr, NaI, $Na_2SO_4$ and $NaNO_3$. Adhesion of those electrolytes may occur when electric and electronic apparatuses are used in coastal area, when a salt-containing liquid such as soy sauce, miso soup or Worcester sauce is spilt over the apparatuses, or when liquids which contain alkali metal ions or organic acid ions such as soft drinks, jeuce, coffee and tea are spilt over the apparatuses. Hydrogen ion and hydroxyl ion which are produced by ion exchange are re-bonded to be converted to water. Since the resulting water has a high electric resistance and can be removed by drying, it does not lower the insulation.

Particularly preferred combination is the strongly acidic cation exchange resin and the strongly basic anion exchange resin from the viewpoint of ion exchange speed and ion exchange capacity. Other possible combinations are combination of the strongly acidic cation exchange resin and the weakly basic anion exchange resin, combination of the weakly acidic cation exchange resin and the strongly basic anion exchange resin, and combination of the weakly acidic cation exchange resin and the weakly basic anion exchange resin.

The electrolyte is not limited to the above-mentioned salts of strong acid and strong base, and includes a salt of strong acid with weak base such as $(NH_4)_2SO_4$, $NH_4Cl$ or $Al_2(SO_4)_3$; a salt of strong base with weak acid such as $Na_2CO_3$, $K_2CO_3$ or $NaHCO_3$; a salt of weak acid with weak base such as $(NH_4)_3PO_4$, $(NH_4)_3AsO_4$ or $FeAsO_4$; and the like.

The ratio of amounts of the cation exchangeable material and anion exchangeable material may be selected optionally depending on kind of the electrolyte, kind of the ion-exchangeable materials, etc. For example, it is preferable that the ratio (weight ratio) of the cation exchangeable material to the anion exchangeable material is from about 9/1 to about 1/9, more preferably from about 2/1 to about 1/2 from a point that the so mixed ion-exchangeable material can be used for any electrolyte.

It is preferable that in case that the electrolyte is the salt of strong acid with strong base, the ratio is at around an equivalent amount; that in case that the electrolyte is the salt of strong base and weak acid, an amount of the cation exchangeable material is larger; and that in case that the electrolyte is the salt of strong acid and weak base, an amount of the anion exchangeable material is larger.

(2) Embodiment of using cation exchangeable material alone

This embodiment is suitable in case that the electrolyte is a base. Examples of such a basic electrolyte are, for instance, hydroxides of alkali metal such as Na, K or Li; hydroxides of alkaline earth metal such as Mg or Ca; aqueous ammonia; hydroxides of primary, secondary or tertiary ammonium; and the like. There can occur adhesion of those hydroxides to electric and electronic apparatuses used in chemical laboratory when they are vaporized or spilt erroneously or when they are used as an electrolyte for an electrolytic condenser and leak out of the condenser.

The cation exchangeable material can also be used effectively in cases of the salt of strong base and weak acid and the salt of weak base and weak acid.

As the cation exchangeable material, any of those mentioned above can be used. From the viewpoint of a specific gravity, the ion-exchange resin is preferable. Particularly, the strongly acidic cation exchange resin is preferable from the viewpoint of ion exchange speed and ion exchange capacity. From the viewpoint of heat resistance, the inorganic cation exchangeable substance is preferable.

(3) Embodiment of using anion exchangeable material alone

This embodiment is suitable in case where the electrolyte is an acid. Examples thereof are, for instance, inorganic acids such as chloric acid, sulfuric acid, nitric acid and phosphric acid; and organic acids such as formic acid, propionic acid and phthalic acid. There can occur adhesion of those acids, for example, when electric and electronic apparatuses are used in chemical laboratory.

The anion exchangeable material can also be used effectively in cases of the salt of strong acid and weak acid and the salt of weak acid and weak base.

As the anion exchangeable material, any of those mentioned above can be used. From the viewpoint of a specific gravity, the ion-exchange resin is preferable. Particularly, the strongly acidic anion exchange resin is preferable from the viewpoint of ion exchange speed and ion exchange capacity. From the viewpoint of heat resistance, the inorganic anion exchangeable substance is preferable.

Examples of combinations of the ion-exchangeable materials are as mentioned above, and it is possible to employ combination of two or more of cation exchangeable materials and combination of two or more of anion exchangeable materials.

When using both of the cation exchangeable material and the anion exchangeable material, the obtained paints are advantageous since they can be used for any electrolyte. In case of single use, though applicable kind of the electrolytes is decreased, there is an advantage that an amount of ions to be captured can be increased by increasing an amount of the ion-exchangeable material suitable for the ions to be captured without changing a total amount of the ion-exchangeable material.

The insulation film forming agent which is another component of the insulating paint of the present invention is used to hold the ion-exchangeable material at a desired part and it is preferable that such an agent has, in addition to electric insulation property and film forming property, property of homogeneously dispersing of the ion-exchangeable material and adhesion to circuit board. Kind of the insulation film forming agent is not limited.

As the electric insulation film forming agent, for example, a hydrophilic film forming agent and a hydrophobic film forming agent can be used.

Examples of the hydrophilic film forming agent are, for instance, hydrophilic resins such as acrylic resin, alkyd resin, melamine resin, urea resin, phenol resin, epoxy resin, cellulosic resin, urethane resin, polyacetal resin, polyvinylalcohol resin and vinyl chloride resin, which are hydrophilized with hydrophilic groups such as carboxyl group, hydroxyl group and amino group. Among them, the hydrophilic acrylic resin is particularly preferable from the viewpoints of rapid drying and curing at room temperature.

Examples of the hydrophobic film forming agent are, for instance, hydrophobic resins such as cellulosic resin, alkyd resin, melamine resin, urea resin, vinyl chloride resin, butyral resin, aminoalkyd resin, acrylic resin, epoxy resin, unsaturated polyester resin, urethane resin and olefin resin (for example, polyethylene and polypropylene). Among them, the cellulosic resin is particularly preferable from the viewpoint of rapid drying.

Film forming agents which have been used for other fields than paints such as adhesives, sealing agents and tackifying agents can also be used.

Examples of other film forming agents are natural adhesives such as glue and starch paste in addition to chloroprene rubber, nitrile rubber, styrene-butadiene rubber, silicone rubber, poly-n-butylacrylate and the like. Those are included in the electric insulation film forming agents in the present invention.

The insulating paint of the present invention can be obtained basically by mixing the above-mentioned insulation film forming agent and ion-exchangeable material in the presence or absence of solvent.

As the solvent, any of water and an organic solvent can be used. The solvent may be optionally selected depending on kind of the film forming agent to be used.

For example, when the above-mentioned hydrophilic film forming agent is used, water or a hydrophilic organic solvent can be used alone or in a mixture thereof (hereinafter this type of paint may be referred to as "aqueous paint"). The thus obtained paints are advantageous since the electrolyte is easy to be dissolved.

Non-restrictive examples of the hydrophilic organic solvent are one or more of, for instance, alcohols such as methanol, ethanol and isopropanol; polyalcohol derivatives such as propylene glycol monomethyl ether and ethylene glycol monoethyl ether; ethers such as tetrahydrofuran and dioxane; acetone and the like. The hydrophilic organic solvent is not limited to them.

When the above-mentioned hydrophobic film forming agent is used, the hydrophobic organic solvent is preferable as the solvent. Non-restrictive examples of the hydrophobic organic solvent are one or more of, for instance, hydrocarbons such as benzene, toluene, xylene and thinner; esters such as methyl acetate and ethyl acetate; ketones such as methyl ethyl ketone and methyl isobutyl ketone; and the like. Those hydrophobic organic solvents are advantageous since the drying speed of the obtained paint is high.

Depending on kind of the insulation film forming agent, there can be used mixed solvents such as water-hydrophilic organic solvent, water-hydrophobic organic solvent (emulsion) and hydrophilic organic solvent-hydrophobic organic solvent.

Also the insulating paint of the present invention may be of non-solvent system. Examples of the insulation film forming agent used therefor are, for instance, those which have been used for solventless paints, such as epoxy resin, urethane resin, unsaturated polyester resin and silicone resin. Such paints are advantageous because no ventilation equipment is necessary.

The ion-exchangeable material to be mixed is used in the form of granule, fiber, scale, pellet or the like, and the granule is preferable from the viewpoints of dispersibility. In that case, a particle size is not particularly limited, but from the viewpoints of homogeneous dispersibility, easiness of coating and specific surface area, the average particle size is not more than about 100 µm, preferably from about 1 to 100 µm.

An amount of the ion-exchangeable material varies depending on kind of the ion-exchangeable material, kind and amount of electrolyte, degree of dissociation, ionic strength, etc., and is usually from 0.2 to 90% by weight based on solid content of the insulating paint. The amount is preferably from 20 to 80% by weight. The amount may be relatively decreased when the hydrophilic film forming agent is used.

It is preferable that the insulation film forming agent is contained in an amount of from 10 to 99.8% by weight, particularly from 20 to 80% by weight in the insulating paint from the viewpoint of film characteristics such as strength and adhesion, viscosity and sedimentation property of the ion-exchangeable material.

To the insulating paint of the present invention can be added various additives unless ion exchange ability of the ion-exchangeable material is lowered and electric insulation is impaired. Examples of the additives are, for instance, colorants, organic or inorganic fillers, sedimenting inhibitors, repelling inhibitors and the like. Among them, when colorants are added, the coated area can be distinctive clearly and workability is enhanced.

The insulating paint of the present invention is prepared through known methods by optionally mixing the above-mentioned components. The obtained insulating paint may be in the form of dispersion, suspension, emulsion, slurry and paste, and the form of the paint may be selected depending on applying method.

The insulating paint of the present invention can be used to recover insulation by applying to at least an area or a part where the insulation was lowered or to prevent lowering of insulation by previously applying to an area or a part where the insulation is expected to be lowered. The area or part where the insulation is lowered or expected to be lowered are wiring portions of printed circuit board used on various electrical or electronic apparatuses, connection terminals of electronic parts mounted on printed circuit board and portions beneath batteries or electrolytic condensers, but is not limited to them.

When used for protecting the insulation from lowering and recovering the insulation particularly of printed circuit board, as mentioned above, the repairing work can be done at site without replacing the circuit board and very excellent effects can be exhibited from economical and workability points of view. Thus the present invention further relates to the printed circuit board where the coating film of the insulating paint is formed. The coating thickness varies depending on kind and density of the insulation film forming agent and may be selected from a wide range of thickness. When the thickness is too thick, drying is delayed and peeling is easy to occur, and when too thin, defects of the coating film are easy to occur. Therefore, proper thickness is assumed to be in the range of from 1 µm to 1 mm.

The present invention further relates to the method of recovering the lowered insulation of printed circuit board by applying the above-mentioned insulating paint to the part of the printed circuit board where an electrolyte adheres by an external factor to lower the insulation.

Applying method of the insulating paint on the printed circuit board is carried out with a brush, sprayer or the like. Among them, it is preferable to employ the applying method (a method exhibiting a stirring effect) in which mixing with substances causing the lowering of insulation such as electrolytes can be done sufficiently. This is because when applied, capturing of ions is made easy by bringing the electrolyte into contact with the ion-exchangeable material sufficiently and the recovery of the insulation is made rapid and easy by cutting continuity of ions with the insulation film forming agent. As such an applying method, there are, for example, brush coating, etc.

The recovery of the insulation is rapid and the recovered insulation can be maintained for a long period of time by, before applying the insulating paint, removing dusts on the printed circuit board with a sweeper and then wiping with a solvent such as alcohol to remove adhered substances such as oily substances.

The present invention further relates to the method of protecting insulation from lowering on a printed circuit board. Such a method is carried out by applying previously the above-mentioned insulating paint to a part or a whole of surface of the printed circuit board and or to electronic parts mounted or to be mounted on the board.

A major cause for lowering the insulation of the printed circuit board is leakage of the electrolyte from the electrolytic condenser as mentioned above. Therefore, by previously forming a coating film of the insulating paint on the electrolytic condenser itself and the vicinity thereof, even if the leakage occurs, the leaked electrolytic ions are captured by the formed insulation film and thus the lowering of insulation can be prevented. It is a matter of course that the insulation film may be formed on the parts where the insulation must not be lowered or on the whole of the circuit board.

Applying method for protecting the insulation from lowering can be carried out by dipping method, rolling method, curtain flow method or the like, in addition to the applying methods for the recovery of insulation.

The present invention is explained by means of Examples and Comparative Examples hereinbelow. In the following, firstly, are explained procedures for measuring electric insulation resistance to check for observing an effect of the recovery of insulation resistance with respect to the insulating paint used in Examples.

Figure 2:
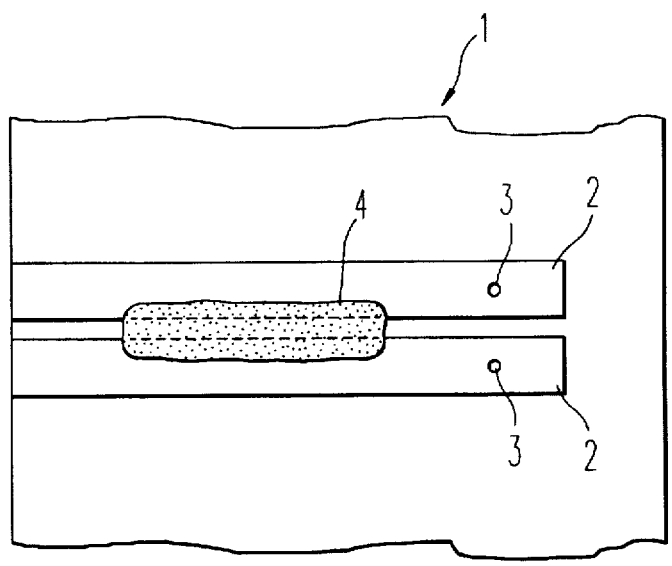
FIG. 2 is a diagrammatic plan view showing a state of an applied electrolyte on a wiring part of the printed circuit board used in Experiments of the present invention.

As shown in FIG. 1, electrodes 2 made of 3 mm wide×80 mm long copper foil were formed at intervals of 1 mm on a board of phenol resin (100×100 mm), and a through hole 3 was made on the electrode 2 to prepare an experimental printed circuit board 1. A 10 μl aqueous solution of 1% by weight of an electrolyte (ditetramethylammonium phthalate (DTAP) or copper sulfate) is dropped with a dropping pipette so that the electrodes 2 and the space therebetween were covered with the electrolyte as shown in FIG. 2. Then the electrolyte is dried at 65° C. for one hour to allow a solid electrolyte region 4 to remain between the electrodes 2. A thin film of solid DTAP can be formed by once making the electrolyte into the form of aqueous solution and then dropping and drying. When the electrolyte is allowed to stand in the air after dried at 65° C., the electrolyte is dissociated due to ambient moisture to form ions, and then the ions electrically connect the electrodes. The board in that state is used as a test piece. Then the insulation resistance between the electrodes 2 is measured and the measured resistance is assumed to be the standard value. The insulation resistance between the electrodes 2 where nothing is made to adhere thereto is not less than 10,000 MΩ. The insulation resistance is measured with an insulation tester.

Figure 3:
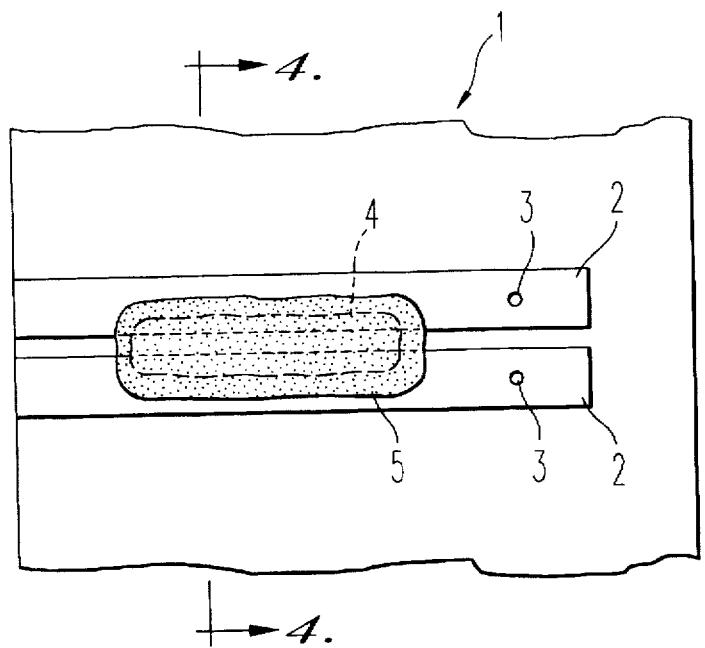
FIG. 3 is a diagrammatic plan view showing a state of application of an electrolyte and then an insulating paint on a wiring part of the printed circuit board used in Experiments of the present invention.
Figure 4:
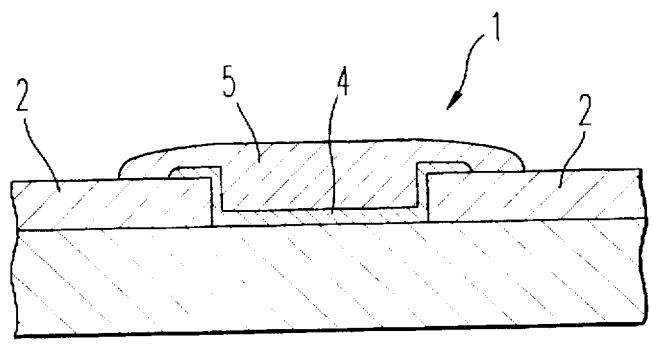
FIG. 4 is an enlarged sectional view cut along the line X—X of FIG. 3.

Then as shown in FIGS. 3 and 4, the insulating paint 5 of the present invention is applied over the electrolyte region 4, dried and cured and after the lapse of one hour, the insulation resistance between the electrodes 2 is again measured to evaluate effect of the insulating paint.

The reason why the granular electrolyte is once made into the form of aqueous solution and then dropping and drying is to decrease irregular variation in insulation resistance of the thin film of the electrolyte formed between the electrodes.

An amount of insulation resistance recovered which can be used practically varies depending on specifications of an electronic circuit, that is, a distance between wirings, applied voltage, voltage at break between the wirings, etc. and is also affected by environmental conditions and required reliability. Therefore, the practicable insulation resistance recovered is not decided unconditionally. In case of electrical apparatuses for domestic use such as television set, audio equipment, refrigerator and washing machine, required insulation resistance is at least 1 MΩ, preferably not less than 10 MΩ.

In the experiments for measuring the insulation resistance, DTAP, copper sulfate, etc. were used as the electrolyte. However, the electrolyte to be used to evaluate the insulation is not limited to them. Substances which can be dissociated by moisture absorption to yield ions and to become electrically conductive, such as chlorides, sulfates, acids, alkalis or the like may be used (cf. Example 14).

EXAMPLE 1

The insulating paint used was prepared by mixing a strongly acidic cation exchange resin having sulfonic acid group which was a functional group having cation exchange ability (Diaion FMK-10 available from Mitsubishi Kagaku Kabushiki Kaisha) and a strongly basic anion exchange resin having quaternary ammonium group which was a functional group having anion exchange ability (Diaion FMA-10 available from Mitsubishi Kagaku Kabushiki Kaisha) with an aqueous paint of an acrylic resin having the following composition (Varnish available from Atomics Kabushiki Kaisha). The average particle size of both ion-exchange resins was about 100 μm. With respect to the solid contents of the obtained insulating paint, the strongly acidic cation exchange resin and the strongly basic anion exchange resin were mixed in amounts shown in Table 1. An amount of 0.1 ml of the insulating paint was dropped on the DTAP adhered portion of the board (test piece) with a dropping pipette, and then dried and cured. After lapse of one hour, insulation resistance was measured in a room (about 20° C., relative humidity: about 75%). The results are shown in Table 1.

Since in Experiment Nos. 1-1 to 1-11, insulation resistances were higher than the standard value of 0.1 MΩ, an effect of recovering the insulation resistance can be recognized. To the contrary, in Experiment No. 1-12 where the ion-exchange resin is not mixed, enough recovering effect is not obtained.

| Composition of the aqueous paint | (% by weight) |
|---|---|
| Water soluble acrylic resin | 35 |
| 2-Ethoxyethanol | 35 to 49 |
| 2-Butoxyethanol | 5 to 10 |
| Isopropanol | 20 to 30 |
| | Total 100 |

TABLE 1

| | Solid content of insulating paint (% by weight) | | | Insulation resistance (MΩ) |
|---|---|---|---|---|
| | Aqueous paint | Ion-exchange resin | | |
| | | Cation | Anion | |
| Standard value | None | None | None | 0.1 |
| Experiment 1-1 | 99.8 | 0.1 | 0.1 | 15 |
| Experiment 1-2 | 98 | 1 | 1 | 54 |
| Experiment 1-3 | 90 | 5 | 5 | 360 |
| Experiment 1-4 | 80 | 10 | 10 | >1000 |
| Experiment 1-5 | 70 | 15 | 15 | >1000 |
| Experiment 1-6 | 60 | 20 | 20 | >1000 |
| Experiment 1-7 | 50 | 25 | 25 | >1000 |
| Experiment 1-8 | 40 | 30 | 30 | >1000 |
| Experiment 1-9 | 30 | 35 | 35 | >1000 |
| Experiment 1-10 | 20 | 40 | 40 | 890 |
| Experiment 1-11 | 10 | 45 | 45 | 21 |
| Experiment 1-12 | 100 | 0 | 0 | 0.9 |

EXAMPLE 2

The insulating paint used was prepared by mixing a strongly acidic cation exchange resin (Diaion FMK-10 available from Mitsubishi Kagaku Kabushiki Kaisha) and a strongly basic anion exchange resin (Diaion FMA-10 available from Mitsubishi Kagaku Kabushiki Kaisha) with an organic solvent-based paint of a polyolefin resin having the following composition (HumiSeal-1B51 available from AR BROWN) in amounts shown in Table 2. The obtained insulating paint was applied on the test piece in the same manner as in Example 1, and then the insulation resistance was measured. The results are shown in Table 2.

In Experiment Nos. 2-1 to 2-11, recovering effects of the insulation resistance are enough. To the contrary, in Experiment No. 2-12 where a paint prepared without mixing a strongly acidic cation exchange resin and a strongly basic anion exchange resin was used, the recovering effect of the insulation resistance is not enough.

| Composition of the organic solvent-based paint | (% by weight) |
|---|---|
| Modified polyethylene | 20 to 30 |
| Toluene | 70 to 80 |
| | Total 100 |

TABLE 2

| | Solid content of insulating paint (% by weight) | | | Insulation resistance (MΩ) |
|---|---|---|---|---|
| | Hydrophobic solvent-based paint | Ion-exchange resin | | |
| | | Cation | Anion | |
| Standard value | None | None | None | 0.1 |
| Experiment 2-1 | 99.8 | 0.1 | 0.1 | 11 |
| Experiment 2-2 | 98 | 1 | 1 | 18 |
| Experiment 2-3 | 90 | 5 | 5 | 220 |
| Experiment 2-4 | 80 | 10 | 10 | >1000 |
| Experiment 2-5 | 70 | 15 | 15 | >1000 |
| Experiment 2-6 | 60 | 20 | 20 | >1000 |
| Experiment 2-7 | 50 | 25 | 25 | >1000 |
| Experiment 2-8 | 40 | 30 | 30 | >1000 |
| Experiment 2-9 | 30 | 35 | 35 | >1000 |
| Experiment 2-10 | 20 | 40 | 40 | 620 |
| Experiment 2-11 | 10 | 45 | 45 | 55 |
| Experiment 2-12 | 100 | 0 | 0 | 0.6 |

EXAMPLE 3

The same experiment as in Example 1 was repeated except that the insulating paint used was prepared by mixing a strongly acidic cation exchange resin alone to the aqueous paint without mixing a strongly basic anion exchange resin. The results are shown in Table 3.

In any of the experiments, recovering effects of the insulation resistance are enough.

TABLE 3

| | Solid content of insulating paint (% by weight) | | | Insulation resistance (MΩ) |
|---|---|---|---|---|
| | Aqueous paint | Ion-exchange resin | | |
| | | Cation | Anion | |
| Standard value | None | None | None | 0.1 |
| Experiment 3-1 | 98 | 2 | 0 | 33 |
| Experiment 3-2 | 90 | 10 | 0 | 130 |
| Experiment 3-3 | 50 | 50 | 0 | 650 |
| Experiment 3-4 | 10 | 90 | 0 | 48 |

EXAMPLE 4

A 10 μl aqueous solution of 1% by weight of copper sulfate was dropped on the board shown in FIG. 1 with a dropping pipette so that the electrodes 2 and the space therebetween were covered with the solution as shown in FIG. 2. The solution was dried at 65° C. for one hour. Then the insulating paint prepared by mixing a strongly basic anion exchange resin (Diaion FMA-10 available from Mitsubishi Kagaku Kabushiki Kaisha) alone with the aqueous paint (varnish available from Atomics Kabushiki Kaisha) was applied with a dropping pipette over the copper sulfate remained between the electrodes 2, and then dried and cured. After lapse of one hour, the insulation resistance between the electrodes 2 was measured. The results are shown in Table 4. In any of Experiments, recovering effects are enough.

TABLE 4

| | Solid content of insulating paint (% by weight) | | | Insulation resistance (MΩ) |
|---|---|---|---|---|
| | Aqueous paint | Ion-exchange resin | | |
| | | Cation | Anion | |
| Standard value | None | None | None | 0.1 |
| Experiment 4-1 | 98 | 0 | 2 | 9.6 |
| Experiment 4-2 | 90 | 0 | 10 | 30 |
| Experiment 4-3 | 50 | 0 | 50 | 210 |
| Experiment 4-4 | 10 | 0 | 90 | 15 |

In Examples 1 to 4, the insulating paint was applied by dropping with the dropping pipette. The recovering effect of the insulation resistance of the insulating paint does not change if spray coating, brush coating, roller coating, etc. are employed as applying method. A recovering speed of the brush coating, etc. is rather high because of its stirring effect (cf. Example 18).

EXAMPLE 5

The cation exchange resin used in Examples 1 to 4 exhibits strong acidity because its functional group having ion exchange ability is sulfonic acid group ($-SO_3H$), and the anion-exchange resin exhibits strong basicity because its functional group having ion exchange ability is quaternary ammonium group ($-NR_3OH$).

In Example 5, there was examined effects in case of combination use of a cation exchange resin having a carboxylic acid group ($-COOH$) as a functional group and exhibiting weak acidity and an anion exchange resin having a primary amine group ($-NH_2$) as a functional group and exhibiting weak basicity. In Experiments 5-1 to 5-3, the applying procedures and measurement were carried out in the same manner as in Experiment 1-7 except that the combination of the ion-exchange resin was different. The results are shown in Table 5. The result of Experiment 1-7 is shown in Table 5 as a reference.

As shown in Table 5, recovering effects of the insulation resistance are enough.

TABLE 5

| | Cation exchange resin | Anion exchange resin | Insulation resistance (MΩ) |
|---|---|---|---|
| Experiment 5-1 | Strongly acidic | Weakly basic | 920 |
| Experiment 5-2 | Weakly acidic | Strongly basic | 250 |
| Experiment 5-3 | Weakly acidic | Weakly basic | 170 |
| Experiment 1-7 | Strongly acidic | Strongly basic | >1000 |

EXAMPLE 6

An average particle size of the strongly acidic cation exchange resin and the strongly basic anion exchange resin which were used in Example 1 was about 100 μm. In Example 6, there was examined influence of the average particle size of the ion-exchange resin on the recovering effect of the insulation resistance.

The strongly acidic cation exchange resin and strongly basic anion exchange resin as used in Example 1 were crushed by a ball mill, respectively to give particles having an average particle size shown in Table 6. The applying procedures and the measurement of the insulation resistance were carried out in the same manner as in Experiment 1-7 except that the insulating paint prepared by mixing those resins with the aqueous paint (varnish available from Atomics Kabushiki Kaisha). The results are shown in Table 6.

TABLE 6

|  | Average particle size (μm) | Insulation resistance (MΩ) |
| --- | --- | --- |
| Experiment 1-7 | 100 | >1000 |
| Experiment 6-1 | 1000 | >1000 |
| Experiment 6-1 | 10 | >1000 |
| Experiment 6-1 | 1 | >1000 |

As shown in Table 6, recovering effects of the insulation resistance are enough. From practical point of view, when dropping the insulating paint with a dropping pipette or applying with a brush, there occurs inconvenience if the particle size of the ion-exchange resin is large. Namely, since the ion-exchange resin usually has a specific gravity larger than that of a paint, the resin immediately sediments when its particle size is large, which results in irregular variation of concentration when dropping with a dropping pipette. Also in case of the brush coating, uniform coating is difficult to obtain when the particle size is large. Therefore, the desirable average particle size is not more than 100 μm. When the particle size is too small, since there occurs secondary aggregation and handling property is poor, it is desirable that the average particle size is not less than 1 μm.

EXAMPLE 7

The same procedures as in Experiment 1-7 were repeated to prepare an insulating paint except that as the insulation film forming agent, Acrose #100V (acrylic emulsion available from Dai Nippon Toryo Kabushiki Kaisha), Vinirose #410 (vinyl emulsion available from Dai Nippon Toryo Kabushiki Kaisha) or Viewtex (aqueous acrylic paint available from Dai Nippon Toryo Kabushiki Kaisha) was used instead of the varnish (aqueous acrylic paint available from Atomics Kabushiki Kaisha). The obtained paint was applied on the test piece and its insulation resistance was measured. The results are shown in Table 7.

TABLE 7

|  | Solid content of insulating paint (% by weight) | | | Insulation resistance (MΩ) |
| --- | --- | --- | --- | --- |
|  | Aqueous paint | Ion-exchange resin | | |
|  | Tradename | Cation | Anion | |
| Experiment 7-1 | Acrose #100V | 50 | 25 | 25 | >1000 |
| Experiment 7-2 | Vinirose #410 | 50 | 25 | 25 | >1000 |
| Experiment 7-3 | Viewtex | 50 | 25 | 25 | >1000 |
| Experiment 1-7 | Varnish | 50 | 25 | 25 | >1000 |

Excellent insulation resistance recovering effects are exhibited with respect to any of the insulating paints.

EXAMPLE 8

Table 8 shows insulation resistance recovering effect when changing a mixing ratio of the cation exchange resin and anion exchange resin which were mixed with each aqueous paint used in Example 7.

When DTAP(salt of weak acid and strong base) adhered to the printed circuit board, insulation resistance recovering effect is exhibited even if a content of the anion exchange resin is lowered.

TABLE 8

|  | Solid content of insulating paint (% by weight) | | | Insulation resistance (MΩ) |
| --- | --- | --- | --- | --- |
|  | Aqueous paint | Ion-exchange resin | | |
|  | Tradename | Cation | Anion | |
| Experiment 8-1 | Acrose #100V | 50 | 45 | 5 | >1000 |
| Experiment 8-2 | Vinirose #410 | 50 | 45 | 5 | >1000 |
| Experiment 8-3 | Viewtex | 50 | 45 | 5 | >1000 |

EXAMPLE 9

The applying procedures on the board, drying and measurement of insulation resistance were repeated in the same manner as in Experiment 2-7 except that a hydrophobic solvent-based paint was prepared from the resin shown in Table 9. The results are shown in Table 10.

Excellent insulation resistance recovering effects are exhibited with respect to any of the paints.

TABLE 9

| Kind of film forming agent | Tradename | Maker |
| --- | --- | --- |
| Alkyd resin | Melami No. 51 | Nippon Yushi Kabushiki Kaisha |
| Polyester resin | 3200V Clear | Nippon Paint Kabushiki Kaisha |
| Acrylic resin | Nippe-acryl | Nippon Paint Kabushiki Kaisha |
| Vinyl resin | Vinylex 2000 | Nippon Paint Kabushiki Kaisha |
| Urethane resin | V-Top-H Top Coat | Dai Nippon Toryo Kabushiki Kaisha |
| Epoxy resin | Eponix #10 | Dai Nippon Toryo Kabushiki Kaisha |
| Urea melamine resin | Melanix 1230 | Nippon Paint Kabushiki Kaisha |
| Phthalic acid | New-bodelac 100 | Nippon Paint Kabushiki Kaisha |
| Olefin resin | HumiSeal-1B51 | AR BROWN CO. |

TABLE 10

|  | Solid content of insulating paint (% by weight) | | | Insulation resistance (MΩ) |
| --- | --- | --- | --- | --- |
|  | Hydrophobic solvent-based | Ion-exchange resin | | |
|  | Tradename | Cation | Anion | |
| Experiment 9-1 | Melami No. 51 | 50 | 25 | 25 | >1000 |
| Experiment 9-2 | 3200V Clear | 50 | 25 | 25 | >1000 |
| Experiment 9-3 | Nippe-acryl | 50 | 25 | 25 | >1000 |
| Experiment 9-4 | Vinilex 2000 | 50 | 25 | 25 | >1000 |
| Experiment 9-5 | V-Top-H Top Coat | 50 | 25 | 25 | >1000 |
| Experiment 9-6 | Eponix #10 | 50 | 25 | 25 | >1000 |
| Experiment 9-7 | Melanix 1230 | 50 | 25 | 25 | >1000 |
| Experiment 9-8 | New-bodelac 100 | 50 | 25 | 25 | >1000 |
| Experiment 9-9 | HumiSeal-1B51 | 50 | 25 | 25 | >1000 |

EXAMPLE 10

In Example 10, there was examined effect of protection of insulation from lowering with respect to the insulating paint of the present invention.

The insulating paint having the same composition as used in Experiment 6-1 was applied on the same board as used in Example 1 with a brush. After drying at room temperature for one hour, test electrodes assumed to be an electronic parts were mounted on the board. Then an aqueous solution of 1% sodium chloride was sprayed onto the board with a sprayer (Experiment 10-1). By such spraying, about 1 mg of sodium chloride adhered per 100 cm² of the board. That board was allowed to stand in an atmosphere of 40° C.×90% RH, and the change of insulation resistance between the electrodes was measured with lapse of time. The results are shown in FIG. 5.

Figure 5:
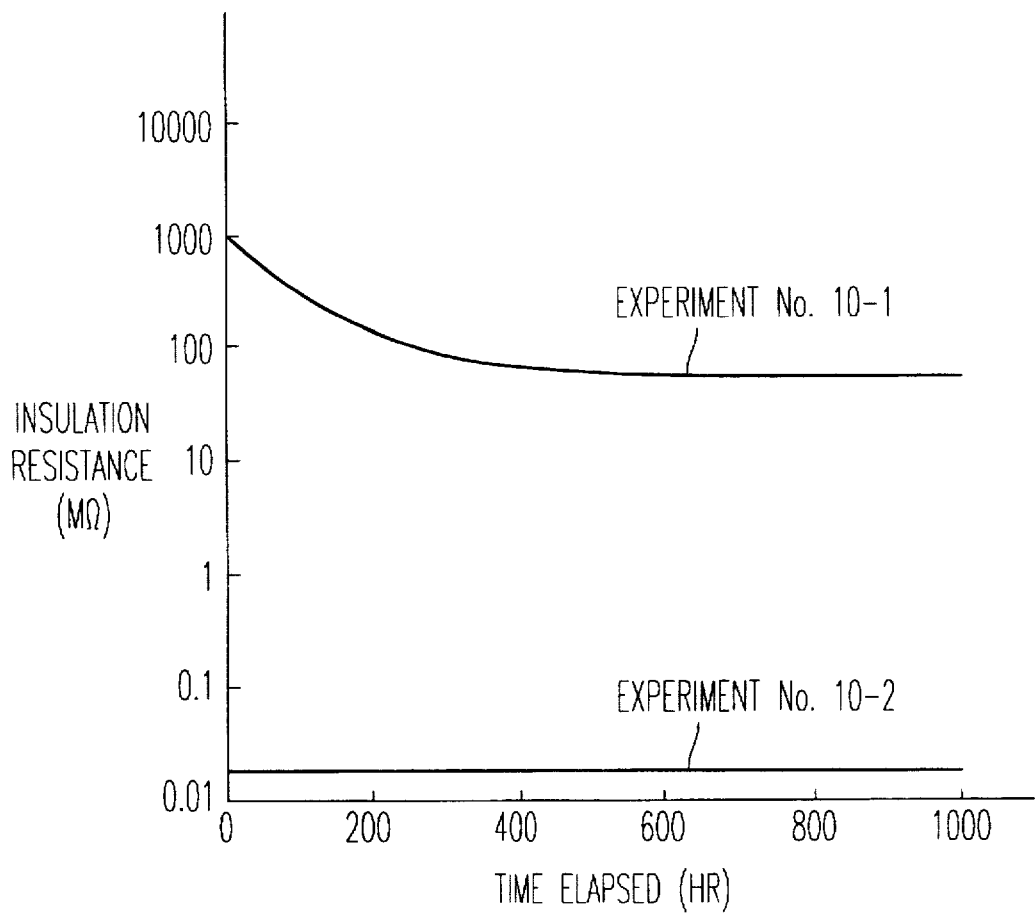
FIG. 5 is a graph showing change of insulation resistance with lapse of time measured in Example 10.

The result of the case where the insulating paint is not applied (Experiment 10-2) is also plotted in FIG. 5.

As it is clear from FIG. 5, excellent insulation can be maintained for a long period of time when the insulating paint of the present invention is applied.

EXAMPLE 11

Electrodes of an electrolytic condenser which caused electrolyte leakage was cleaned with a cloth containing ethanol. After masking of the part to be soldered, the same insulating paint as used in Experiment 1-7 was applied on the electrode part and dried. Then this electrolytic condenser which caused electrolyte leakage was mounted on the same board as used in Example 1 (Experiment 11-1). The board was then allowed to stand in an atmosphere of 40° C.×90% RH, and the change of insulation resistance between the electrodes was measured with lapse of time. The results are shown in FIG. 6.

Figure 6:
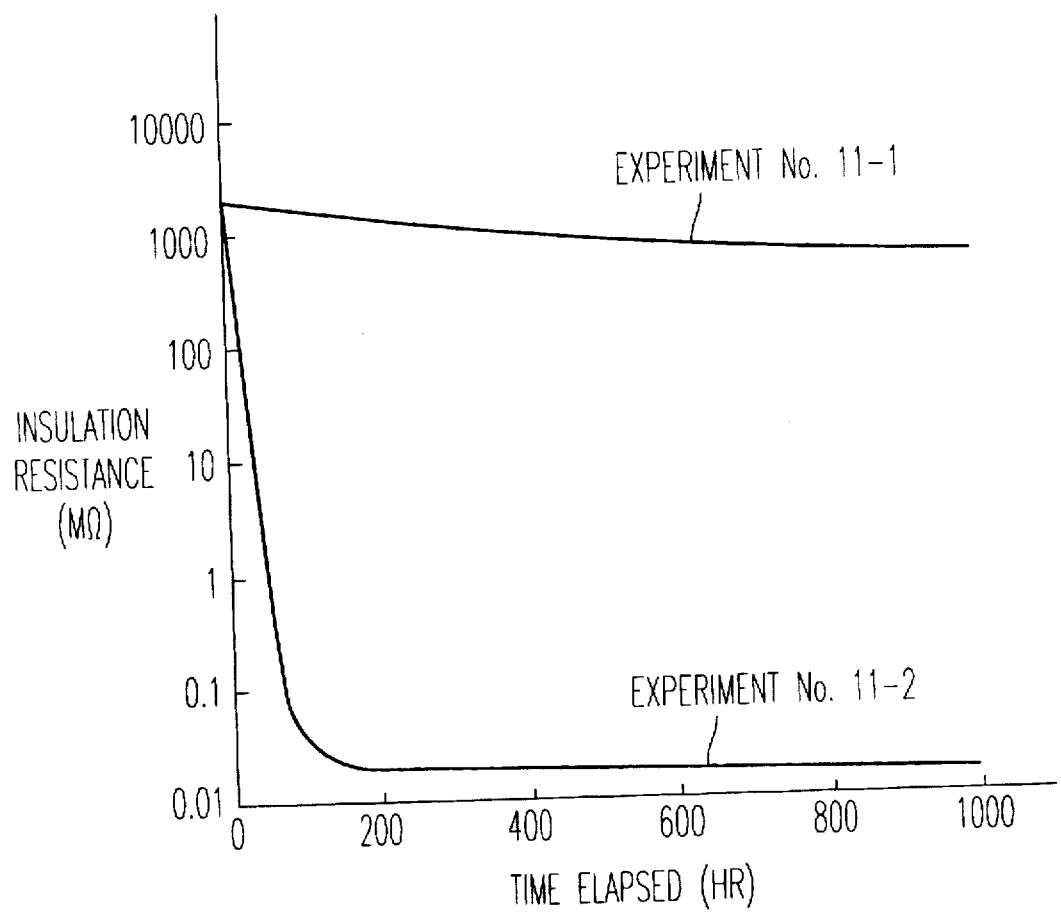
FIG. 6 is a graph showing change of insulation resistance with lapse of time measured in Example 11.

The result of the case where the electrolytic condenser which caused electrolyte leakage without applying the insulating paint is also shown in FIG. 6 (Experiment 11-2).

As it is clear from FIG. 6, excellent effect of insulation can be maintained for a long period of time when the insulating paint of the present invention is applied.

EXAMPLE 12

An amount of 10 μl aqueous solution of 1% DTAP was dropped onto wirings on a printed circuit board where electronic parts were mounted and dried at 65° C. for one hour. An insulation resistance between the wirings at the part where DTAP was dropped was measured at room temperature, and was found to have been lowered to 0.2 MΩ. The same insulating paint as used in Experiment 2-7 was dropped onto the area of the board where DTAP adhered, with a dropping pipette. The paint was then dried and cured at room temperature for one hour, and the insulation resistance was measured again. It was found that the insulation resistance was recovered to not less than 1,000 MΩ.

EXAMPLE 13

With respect to a color television set which could not display picture image due to leakage of electrolytic condenser, the insulating paint used in Experiment 1-7 was applied, with a swab, on the leaked area of the printed circuit board so that the paint was mixed sufficiently with the leaked substance. After allowing to stand at room temperature for 20 minutes for curing, the television set was turned on. A normal picture image was displayed and the television set was all right again.

EXAMPLE 14

Under the same conditions as in Example 1, 1 mg of each substance shown in Table 11 adhered to the part of the board of FIG. 2, to which an electrolyte adhered. The mixing ratio of the ion-exchange resins in the paint were changed as shown in Table 11, and insulation resistance was measured. The results are shown in Table 11.

In case of the salt of strong base and weak acid such as DTAP and a base such as sodium hydroxide or ammonium hydroxide, the paint exhibits an increased insulation resistance even if the anion exchange resin is not mixed.

In case of a salt of weak base and strong acid such as copper sulfate and an acid such as hydrochloric acid or acetic acid, the paint exhibits an increased insulation resistance even if the cation exchange resin is not mixed.

In case of a salt of strong base and strong acid such as sodlium chloride, the paint exhibits an increased insulation resistance by mixing the cation exchange resin and the anion exchange resin in a mixing ratio where ion exchange capacity of the both becomes equivalent.

TABLE 11

| | | Solid content of insulating paint (% by weight) | | | |
|---|---|---|---|---|---|
| | | HumiSeal-1B51 | Ion-exchange resin | | Insulation resistance |
| | | | Cation | Anion | (MΩ) |
| Experiment 14-1 | DTAP | 50 | 50 | 0 | 300 |
| Experiment 14-2 | DTAP | 50 | 40 | 10 | >1000 |
| Experiment 14-3 | Copper sulfate | 50 | 0 | 50 | 150 |
| Experiment 14-4 | Copper sulfate | 50 | 10 | 40 | 600 |
| Experiment 14-5 | Sodium chloride | 50 | 25 | 25 | >1000 |
| Experiment 14-6 | Soy sauce | 50 | 25 | 25 | >1000 |
| Experiment 14-7 | NaOH | 50 | 50 | 0 | >1000 |
| Experiment 14-8 | NH₄OH | 50 | 50 | 0 | >1000 |
| Experiment 14-9 | HCl | 50 | 0 | 50 | >1000 |
| Experiment 14-10 | CH₃COOH | 50 | 0 | 50 | >1000 |

EXAMPLE 15

In Example 15, insulation resistance recovering effect was examined with respect to insulating paints containing insulation film forming agents which are used in other fields than paints.

After DTAP adhered under the same conditions as in Example 1, a composition prepared by mixing an ion-exchange resin with the resin for various fields shown in Table 12 was coated instead of the insulating paint of FIG. 3. After curing, insulation resistance was measured in a room (about 20° C., relative humidity: about 75%). The results are shown in Table 13.

As shown in Table 13, excellent insulation resistance recovering effect is exhibited in any of Experiments.

TABLE 12

| Kind of film forming agent | Tradename | Maker |
|---|---|---|
| Room temperature curable silicone rubber | KE3420 | Shin-Etsu Kagaku Kogyo Kabushiki Kaisha |
| Uv curable silicone rubber | KE4830 | Shin-Etsu Kagaku Kogyo Kabushiki Kaisha |
| Moisture curable urethane resin | Toa-urethane MC clear | Tope Kabushiki Kaisha |
| Solventless rapid drying silicone | SE9187L | Toray Dow Corning Silicone Kabushiki Kaisha |
| Uv curable silicone | V549 | Ryoden Kasei Kabushiki Kaisha |
| Epoxy resin | ARALDITE CY230 | Nagase Chiba Kabushiki Kaisha |
| Natural rubber adhesive | PAPER BOND | Kokuyo Kabushiki Kaisha |
| Adhesive of acrylic emulsion | Marking paste | Konishi Kabushiki Kaisha |
| Animal adhesive | Glue | — |
| Vegetable adhesive | Starch paste | — |

TABLE 13

| | Solid content of insulating paint (% by weight) | | | |
|---|---|---|---|---|
| | Film forming agent | Ion-exchange resin | | Insulation resistance |
| | Tradename | Cation | Anion | (MΩ) |
| Experiment 15-1 | KE3420 | 50 | 25 | 25 | >1000 |
| Experiment 15-2 | KE4830 | 50 | 25 | 25 | >1000 |
| Experiment 15-3 | Toa-urethane MC clear | 50 | 25 | 25 | >1000 |
| Experiment 15-4 | SE9187L | 50 | 25 | 25 | >1000 |
| Experiment 15-5 | V549 | 50 | 25 | 25 | >1000 |
| Experiment 15-6 | ARALDITE CY230 | 50 | 25 | 25 | >1000 |
| Experiment 15-7 | PAPER BOND | 50 | 25 | 25 | >1000 |
| Experiment 15-8 | Marking paste | 50 | 25 | 25 | >1000 |
| Experiment 15-9 | Glue | 50 | 25 | 25 | >1000 |
| Experiment 15-10 | Starch paste | 50 | 25 | 25 | >1000 |

EXAMPLE 16

In Example 16, insulation resistance recovering effect was examined with respect to an insulating paint comprising an inorganic ion-exchangeable material.

A 10 µl aqueous solution of 1% by weight of DTAP was dropped on the circuit board shown in FIG. 1 with a dropping pipette so that the electrodes 2 and the space therebetween were covered with the solution as shown in FIG. 2. The solution was dried at 65° C. for one hour. Then the insulating paint prepared by mixing the insulation film forming agent and the inorganic ion-exchangeable material which are shown in Table 14 was applied with a dropping pipette, over the DTAP remained between the electrodes 2, and then dried and cured. After lapse of one hour, the insulation resistance between the electrodes 2 was measured. The results are shown in Table 14.

As shown in Table 14, excellent insulation resistance recovering effect is exhibited in any of Experiments.

TABLE 14

| | Solid content of insulating paint (% by weight) | | | | |
|---|---|---|---|---|---|
| | Film forming agent | | Inorganic ion-exchangeable substance | | Insulation resistance |
| | Aqueous paint | Hydrophobic solvent-based | Kind | | (MΩ) |
| Experiment 16-1 | 50 | — | Hydrated antimony oxide | 50 | 610 |
| Experiment 16-2 | 50 | — | Zirconium phosphate | 50 | 540 |
| Experiment 16-3 | — | 50 | Hydrated antimony oxide | 50 | 420 |
| Experiment 16-4 | — | 50 | Zirconium phosphate | 50 | 290 |

EXAMPLE 17

In Example 17, insulation resistance recovering effect was examined with respect to an insulating paint comprising an inorganic ion-exchangeable material.

A 10 µl aqueous solution of 1% by weight of copper sulfate was dropped on the circuit board shown in FIG. 1 with a dropping pipette so that the electrodes 2 and the space therebetween were covered with the solution as shown in FIG. 2. The solution was dried at 65° C. for one hour. Then the insulating paint prepared by mixing the insulation film forming agent and the inorganic ion-exchangeable material which are shown in Table 15 was applied with a dropping pipette, over the copper sulfate remained between the electrodes 2, and then dried and cured. After lapse of one hour, the insulation resistance between the electrodes 2 was measured. The results are shown in Table 15.

As shown in Table 15, excellent insulation resistance recovering effect is exhibited in any of Experiments.

TABLE 15

| | Solid content of insulating paint (% by weight) | | | | |
|---|---|---|---|---|---|
| | Film forming agent | | Inorganic ion-exchangeable substance | | Insulation resistance |
| | Aqueous paint | Hydrophobic solvent-based | Kind | | (MΩ) |
| Experiment 17-1 | 50 | — | Hydrotalcite | 50 | 250 |
| Experiment 17-2 | 50 | — | Hydroxyapatite | 50 | 180 |
| Experiment 17-3 | — | 50 | Hydrotalcite | 50 | 160 |
| Experiment 17-4 | — | 50 | Hydroxyapatite | 50 | 130 |

EXAMPLE 18

In Example 18, there was examined influence of the applying method on insulation resistance recovering effect with respect to the insulating paint of the present invention.

A 10 µl aqueous solution of 1% by weight of DTAP was dropped on the circuit board shown in FIG. 1 with a dropping pipette so that the electrodes 2 and the space therebetween were covered with the solution as shown in FIG. 2. The solution was dried at 65° C. for one hour. Then change of the insulation resistance immediately after the coating was measured with the lapse of time with respect to the case where 0.1 ml of the insulating paint used in Experiment 1-7 was dropped with a dropping pipette (Experiment 18-1), and the case where the applying was carried out with a brush so that the insulating paint and DTAP were mixed sufficiently (Experiment 18-2). The results are shown in FIG. 7.

Figure 7:
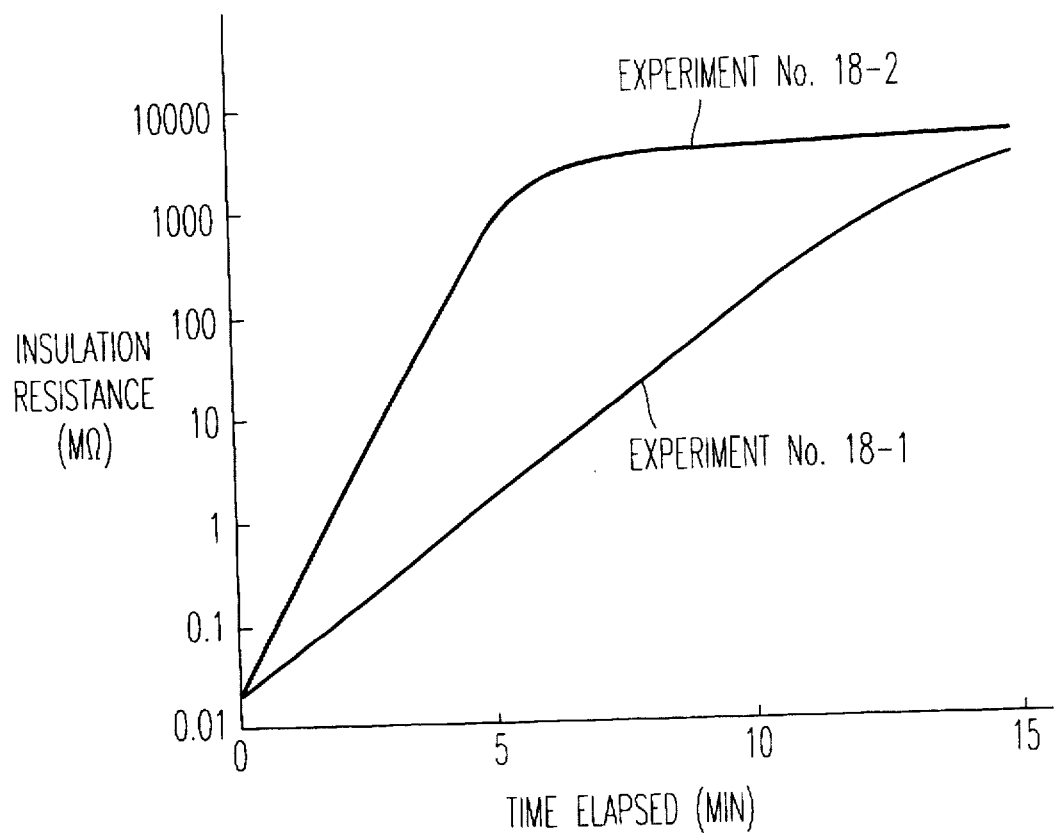
FIG. 7 is a graph showing change of insulation resistance with lapse of time measured in Example 18.

As it is clear from FIG. 7, the recovered insulation resistance reaches not less than 1,000 MΩ in any applying methods. The insulation resistance recovering speed of the case where the coating is carried out with a brush so that the insulating paint and DTAP were mixed sufficiently is rather higher.

When the insulating paint comprising the electric insulation film forming agent and the ion-exchangeable material is applied on an area of a printed circuit board where insulation was lowered, the insulation can be recovered, and when the insulating paint is previously applied on an area of a printed circuit board where insulation is expected to be lowered, the lowering of insulation can be prevented.

What we claim is:

1. A coating composition for repairing printed circuit boards that have been damaged by contact with an electrolyte, comprising:

a) a cation exchange resin and an anion exchange resin in a ratio of 9:1 to 1:9 by weight, each resin having an average particle size from 1 μm to 100 μm, and b) a hydrophilic film forming resin.

2. The composition of claim 1, wherein the cation exchange resin is a strongly acidic cation exchange resin.

3. The composition of claim 1, wherein the anion exchange resin is a strongly basic anion exchange resin.

4. The coating composition of claim 1, wherein the amount of ion-exchange resin in the composition is from 0.2 to 90% by weight.

5. The coating composition of claim 1, wherein the hydrophilic film forming resin is selected from the group consisting of acrylic resin, alkyd resin, melamine resin, urea resin, phenol resin, epoxy resin, cellulosic resin, urethane resin, polyacetal resin, polyvinyl alcohol resin and polyvinyl chloride resin, wherein said resins have hydrophilic groups.

6. The coating composition of claim 1, further comprising a solvent.

7. The coating composition of claim 6, wherein the solvent is water or a hydrophilic organic solvent.

* * * * *